(12) United States Patent
Todd et al.

(10) Patent No.: US 7,674,728 B2
(45) Date of Patent: Mar. 9, 2010

(54) DEPOSITION FROM LIQUID SOURCES

(75) Inventors: Michael A Todd, Phoenix, AZ (US); Ivo Raaijmakers, Bilthoven (NL)

(73) Assignee: ASM America, Inc., Boise, ID (US)

( * ) Notice: Subject to any disclaimer, the term of this patent is extended or adjusted under 35 U.S.C. 154(b) by 46 days.

(21) Appl. No.: 11/693,556

(22) Filed: Mar. 29, 2007

(65) Prior Publication Data

US 2007/0166966 A1 Jul. 19, 2007

Related U.S. Application Data

(63) Continuation of application No. 10/933,978, filed on Sep. 3, 2004, now Pat. No. 7,253,084.

(51) Int. Cl.
*H01L 21/469* (2006.01)
(52) U.S. Cl. .............. 438/788; 257/E21.115; 257/E21.16; 257/E21.266; 427/255.38
(58) Field of Classification Search .............. 438/788; 427/255.38; 257/E21.115, E21.16, E21.269, 257/E21.271, E21.478, E21.493, E21.266
See application file for complete search history.

(56) References Cited

U.S. PATENT DOCUMENTS

| | | | |
|---|---|---|---|
| 4,262,631 A | 4/1981 | Kubacki | |
| 4,277,320 A | 7/1981 | Beguwala et al. | |
| 4,298,629 A | 11/1981 | Nozaki et al. | |
| 4,363,828 A | 12/1982 | Brodsky et al. | |
| 4,495,218 A | 1/1985 | Azuma et al. | |
| 4,585,671 A | 4/1986 | Kitagawa et al. | |
| 4,610,859 A | 9/1986 | Miyagawa et al. | |
| 4,683,146 A * | 7/1987 | Hirai et al. | 427/583 |
| 4,684,542 A | 8/1987 | Jasinski et al. | |
| 4,715,937 A | 12/1987 | Moslehi et al. | |
| 4,720,395 A * | 1/1988 | Foster | 427/162 |
| 4,828,224 A | 5/1989 | Crabb et al. | |
| 4,834,020 A | 5/1989 | Bartholomew | |
| 4,849,259 A | 7/1989 | Biro et al. | |
| 4,851,095 A | 7/1989 | Scobey et al. | |
| 4,891,103 A | 1/1990 | Zorinsky et al. | |

(Continued)

FOREIGN PATENT DOCUMENTS

GB 2 298 313 A 8/1996

(Continued)

OTHER PUBLICATIONS

Ikoma et al., Growth of Si/3C-SiC/Si(100) hetrostructures by pulsed supersonic free jets, Applied Physics Letters, vol. 75, No. 25, pp. 3977-3979, Dec. 1999.

(Continued)

*Primary Examiner*—Caridad M Everhart
(74) *Attorney, Agent, or Firm*—Knobbe, Martens, Olson & Bear LLP

(57) ABSTRACT

A liquid injector is used to vaporize and inject a silicon precursor into a process chamber to form silicon-containing layers during a semiconductor fabrication process. The injector is connected to a source of silicon precursor, which preferably comprises liquid trisilane in a mixture with one or more dopant precursors. The mixture is metered as a liquid and delivered to the injector, where it is then vaporized and injected into the process chamber.

11 Claims, 10 Drawing Sheets

U.S. PATENT DOCUMENTS

| | | | |
|---|---|---|---|
| 5,204,314 | A | 4/1993 | Kirlin et al. |
| 5,221,556 | A | 6/1993 | Hawkins et al. |
| 5,227,329 | A | 7/1993 | Kobayashi et al. |
| 5,272,880 | A | 12/1993 | Nishizato et al. |
| 5,389,398 | A | 2/1995 | Suzuki et al. |
| 5,389,570 | A | 2/1995 | Shiozawa |
| 5,451,260 | A * | 9/1995 | Versteeg et al. ............. 118/725 |
| 5,453,858 | A | 9/1995 | Yamazaki |
| 5,536,323 | A | 7/1996 | Kirlin et al. |
| 5,607,724 | A | 3/1997 | Beinglass et al. |
| 5,614,257 | A | 3/1997 | Beinglass et al. |
| 5,648,293 | A | 7/1997 | Hayama et al. |
| 5,656,531 | A | 8/1997 | Thakur et al. |
| 5,695,819 | A | 12/1997 | Beinglass et al. |
| 5,698,771 | A | 12/1997 | Shields et al. |
| 5,700,520 | A | 12/1997 | Beinglass et al. |
| 5,711,816 | A | 1/1998 | Kirlin et al. |
| 5,719,417 | A | 2/1998 | Roeder et al. |
| 5,786,027 | A | 7/1998 | Rolfson |
| 5,789,030 | A | 8/1998 | Rolfson |
| 5,837,580 | A | 11/1998 | Thakur et al. |
| 5,874,129 | A | 2/1999 | Beinglass et al. |
| 5,876,503 | A | 3/1999 | Roeder et al. |
| 5,876,797 | A | 3/1999 | Beinglass et al. |
| 5,885,869 | A | 3/1999 | Turner et al. |
| 5,907,792 | A | 5/1999 | Droopad et al. |
| 5,916,365 | A | 6/1999 | Sherman |
| 6,015,590 | A | 1/2000 | Suntola et al. |
| 6,027,705 | A | 2/2000 | Kitsuno et al. |
| 6,056,823 | A | 5/2000 | Sajoto et al. |
| 6,082,714 | A | 7/2000 | Dornfest et al. |
| 6,083,810 | A | 7/2000 | Obeng et al. |
| 6,087,229 | A | 7/2000 | Aronowitz et al. |
| 6,093,252 | A | 7/2000 | Wengert et al. |
| 6,096,134 | A | 8/2000 | Zhao et al. |
| 6,136,654 | A | 10/2000 | Kraft et al. |
| 6,159,828 | A | 12/2000 | Ping et al. |
| 6,171,662 | B1 | 1/2001 | Nakao |
| 6,197,669 | B1 | 3/2001 | Twu et al. |
| 6,197,694 | B1 | 3/2001 | Beinglass |
| 6,200,893 | B1 | 3/2001 | Sneh |
| 6,228,181 | B1 | 5/2001 | Yamamoto et al. |
| 6,244,575 | B1 | 6/2001 | Vaartstra et al. |
| 6,252,295 | B1 | 6/2001 | Cote et al. |
| 6,258,170 | B1 | 7/2001 | Somekh et al. |
| 6,271,054 | B1 | 8/2001 | Ballantine et al. |
| 6,273,951 | B1 | 8/2001 | Vaartstra |
| 6,326,311 | B1 | 12/2001 | Ueda et al. |
| 6,391,803 | B1 | 5/2002 | Kim et al. |
| 6,409,839 | B1 | 6/2002 | Sun et al. |
| 6,455,892 | B1 | 9/2002 | Okuno et al. |
| 6,468,924 | B2 | 10/2002 | Lee et al. |
| 6,503,846 | B1 | 1/2003 | Niimi et al. |
| 6,528,530 | B2 | 3/2003 | Zeitlin et al. |
| 6,537,910 | B1 | 3/2003 | Burke et al. |
| 6,589,868 | B2 | 7/2003 | Rossman |
| 6,613,695 | B2 | 9/2003 | Pomarede et al. |
| 6,638,879 | B2 | 10/2003 | Hsich et al. |
| 6,640,840 | B1 | 11/2003 | MacNeil |
| 6,824,816 | B2 | 11/2004 | Aaltonen et al. |
| 7,005,392 | B2 | 2/2006 | Baum et al. |
| 7,182,979 | B2 * | 2/2007 | Westmoreland et al. .. 427/248.1 |
| 2001/0020448 | A1 * | 9/2001 | Vaartstra et al. ............. 118/724 |
| 2001/0032986 | A1 | 10/2001 | Miyasaka |
| 2002/0047151 | A1 | 4/2002 | Kim et al. |
| 2002/0073925 | A1 | 6/2002 | Noble et al. |
| 2002/0098627 | A1 | 7/2002 | Pomarede et al. |
| 2002/0168868 | A1 | 11/2002 | Todd |
| 2002/0192375 | A1 * | 12/2002 | Sun et al. ................ 427/255.28 |
| 2002/0197831 | A1 | 12/2002 | Todd et al. |
| 2003/0022528 | A1 | 1/2003 | Todd |
| 2003/0059535 | A1 | 3/2003 | Luo et al. |
| 2003/0082300 | A1 | 5/2003 | Todd et al. |
| 2003/0175650 | A1 | 9/2003 | De Ridder et al. |
| 2005/0079692 | A1 | 4/2005 | Samoilov et al. |
| 2005/0118837 | A1 | 6/2005 | Todd et al. |
| 2005/0188923 | A1 * | 9/2005 | Cook et al. ................. 118/728 |
| 2006/0110930 | A1 | 5/2006 | Senzaki |

FOREIGN PATENT DOCUMENTS

| | | |
|---|---|---|
| JP | 57209810 | 12/1982 |
| JP | 59078918 | 5/1984 |
| JP | 59078919 | 5/1984 |
| JP | 60043485 | 3/1985 |
| JP | 61-095535 | 5/1986 |
| JP | 61153277 | 7/1986 |
| JP | 62076612 | 4/1987 |
| JP | 63003414 | 1/1988 |
| JP | 63003463 | 1/1988 |
| JP | 01-179710 | 7/1989 |
| JP | 1217956 | 8/1989 |
| JP | 1268064 | 10/1989 |
| JP | 2155225 | 6/1990 |
| JP | 3091239 | 4/1991 |
| JP | 3185817 | 8/1991 |
| JP | 3187215 | 8/1991 |
| JP | 3292741 | 12/1991 |
| JP | 4323834 | 11/1992 |
| JP | 5021378 | 1/1993 |
| JP | 5062911 | 3/1993 |
| JP | 7249618 | 9/1995 |
| JP | 8242006 | 9/1996 |
| JP | 2000-100811 | 4/2000 |
| WO | WO 02/43115 A2 | 5/2002 |
| WO | WO 02/064853 | 8/2002 |

OTHER PUBLICATIONS

International Search Report and Written Opinion for International Application No. PCT/US2006/047805. May 8, 2007.

Iyer, R. Suryanarayanan et al., "A process Method of Silicon Nitride Atomic Layer Cyclic Deposition," Semicon Taiwan 2001, pp. 17-25.

* cited by examiner

DEPOSITION FROM LIQUID SOURCES

REFERENCE TO RELATED APPLICATIONS

This application is a continuation of U.S. application Ser. No. 10/933,978, filed Sep. 3, 2004.

In addition, this application is related to U.S. application Ser. No. 10/074,564, THIN FILMS AND METHODS OF MAKING THEM, filed Feb. 11, 2002; U.S. application Ser. No. 10/074,633, DEPOSITION OVER MIXED SUBSTRATES USING TRISILANE, filed Feb. 11, 2002; U.S. application Ser. No. 10/074,563, IMPROVED PROCESS FOR DEPOSITION OF SEMICONDUCTOR FILMS, filed Feb. 11, 2002; and U.S. application Ser. No. 10/623,482, METHOD TO FORM ULTRA HIGH QUALITY SILICON-CONTAINING LAYERS, filed Jul. 18, 2003, all of which are hereby incorporated by reference in their entireties.

BACKGROUND OF THE INVENTION

1. Field of the Invention

This invention relates generally to semiconductor fabrication and, more particularly, to injection of liquid silicon precursors into process chambers.

2. Description of the Related Art

Silicon-containing materials (e.g., pure silicon, silicon germanium, silicon germanium carbon, silicon carbon alloys, silicon carbide, etc.) are widely used in the microelectronic devices manufactured today. Commonly, these silicon-containing materials are part of silicon-containing layers that form various parts of the microelectronic devices. For a variety of performance and efficiency-related reasons, these devices are continually being made smaller. As the dimensions of these microelectronic devices decrease, however, the physical characteristics of deposited layers, including uniformity in thickness, composition, and coverage, are becoming even more strictly limited. Moreover, the transitioning of the semiconductor industry from wafers that are 200 millimeters (mm) in diameter to wafers that are 300 mm in diameter, and even larger wafers in the future, is further making the achievement of these stringent requirements for thickness, composition, and coverage uniformity more difficult.

Silicon-containing films are typically deposited using silane ($SiH_4$) as a silicon precursor. Deposition of very thin films with uniform elemental concentrations represents a serious challenge for vapor deposition processes relying on conventional silicon precursors, however. Typical furnace-based deposition processes that utilize silane are generally unable to deposit continuous, smooth and homogeneous films having a thickness of 100 Å or less. Similarly, typical single wafer thermal CVD processes also suffer from an inability to deposit smooth, homogeneous thin film materials with a thickness of 150 Å or less.

Higher silanes such as disilane and trisilane are sometimes mentioned as silicon precursor alternatives to silane, but in most cases only silane was investigated. Disilane ($Si_2H_6$) is known to be less stable than silane, and in deposition experiments employing disilane it was reported that disilane gives poor step coverage and that the deposition reaction is too violent to be controlled within the temperature range of 400° to 600° C. See, e.g., U.S. Pat. No. 5,227,329. It is also known that trisilane ($Si_3H_8$) is even less thermally stable than silane.

Dischlorosilane (DCS) and trichlorosilane (TCS) have also been used as silicon precursors. These precursors are typically supplied in vapor form by use of bubblers, which are discussed further below.

The challenges related to meeting ever more stringent requirements for film uniformity are further exacerbated when forming compound silicon-containing films (e.g., silicon germanium, silicon germanium carbon, silicon carbon alloys, silicon carbide, etc.). Likewise, silicon-containing films can contain dopants and regulating the level of these dopants can also pose challenges.

In particular, many doped silicon-containing films have electronic band gap energies that are a function of their specific elemental composition. By incorporating dopant elements, primarily derived from the Group III and Group V families of elements, these semiconductors can be transformed into p-type (electron deficient) and n-type (electron rich) semiconductors. These doped films are the building blocks for a number of microcircuit devices, including transistors. The level and uniformity of doping in these layers influence the electronic properties of the layers, which in turn can influence the properties of the devices incorporating that layer.

Many dopants, e.g., halides, and precursors for compound silicon-containing films come from liquid sources, i.e., precursors that are liquids at room temperature and atmospheric pressure ("standard conditions"). In contrast to gaseous precursors such as silane, which can be directly flowed into a process chamber, a bubbler is typically used to deliver liquid precursors to a process chamber. Typically, a carrier gas such as nitrogen is bubbled through a heated liquid to pick up precursor molecules in vapor form and carry them into the processing chamber. Undesirably, the flow of the liquid precursor through a bubbler is indirectly controlled via control of the flow of carrier gas bubbled through the liquid precursor. Because the flow of liquid precursor is indirect and dependent on the vapor pressure of the precursor, metering the level of precursor entering a process chamber can be imprecise. Moreover, in cases where there is a mixture of liquid precursors, the amount of precursor taken up with the carrier gas is dependent on the vapor pressure of each of these precursors, further adding to imprecision in metering. This imprecision in the ability to meter dopants or other constituent parts of compound silicon-containing films further contributes to uniformity problems with deposited films, especially as device dimensions shrink and wafers grow larger.

In addition, bubblers have problems delivering materials having very low vapor pressures. For example, in the space between the bubbler and the processing chamber, these materials can condense if they are allowed to cool or may decompose if they are continually heated near the temperatures required for vaporization.

Consequently, there is a need for systems and methods of effectively delivering precursors to a process chamber to form silicon-containing layers that are highly uniform and conformal.

SUMMARY OF THE INVENTION

In accordance with one aspect of the invention, a system is provided for semiconductor processing. The system comprises a process chamber having an interior volume. The system also comprises a liquid injector configured to convert a liquid into a gas. The liquid injector is in fluid communication with the interior volume and a precursor source feeds into the liquid injector. The precursor source comprises a liquid silicon precursor having the chemical formula $Si_nH_{2n+2}$, where $n \geq 3$. The system also comprises a liquid mass flow controller for metering the liquid precursor. The controller is in line between the precursor source and the liquid injector. It will be appreciated that, as used herein, the liquid mass flow controller can be any device able to regulate the mass flow of a liquid.

In accordance with another aspect of the invention, a liquid injection system is provided for semiconductor processing. The system comprises a liquid vaporizer. The liquid vaporizer is configured to release a liquid silicon precursor as a vapor. The system also comprises a liquid silicon precursor source. The liquid silicon precursor source is in liquid communication with the liquid injector. A mass flow controller and valves connect the liquid precursor source and the liquid vaporizer. The mass flow controller and valves are configured to meter the liquid silicon precursor in liquid form. The liquid silicon precursor comprises trisilane.

In accordance with another aspect of the invention, an apparatus is provided for semiconductor processing. The apparatus comprises a liquid silicon precursor source comprising a mixture of trisilane and an electrical dopant. The liquid silicon precursor source is configured to connect to a liquid mass flow controller to meter the mixture as a liquid.

In accordance with yet another aspect of the invention, a method is provided for semiconductor processing. The method comprises converting a liquid silicon precursor into a precursor gas by flowing the liquid silicon precursor through a hot ambient. The precursor gas is flown through a process chamber. The liquid silicon precursor comprises trisilane. The temperature of the hot ambient is greater than the boiling point of trisilane under processing conditions at a location where converting a liquid silicon precursor occurs.

In accordance with another aspect of the invention is a method for semiconductor fabrication. The method comprises metering a precursor liquid comprising trisilane and vaporizing the precursor liquid after metering. The vaporized precursor liquid is injected into the process chamber.

BRIEF DESCRIPTION OF THE DRAWINGS

The invention will be better understood from the detailed description of the preferred embodiments and from the appended drawings, which are meant to illustrate and not to limit the invention, and wherein.

DETAILED DESCRIPTION OF THE PREFERRED EMBODIMENT

Figure 1:
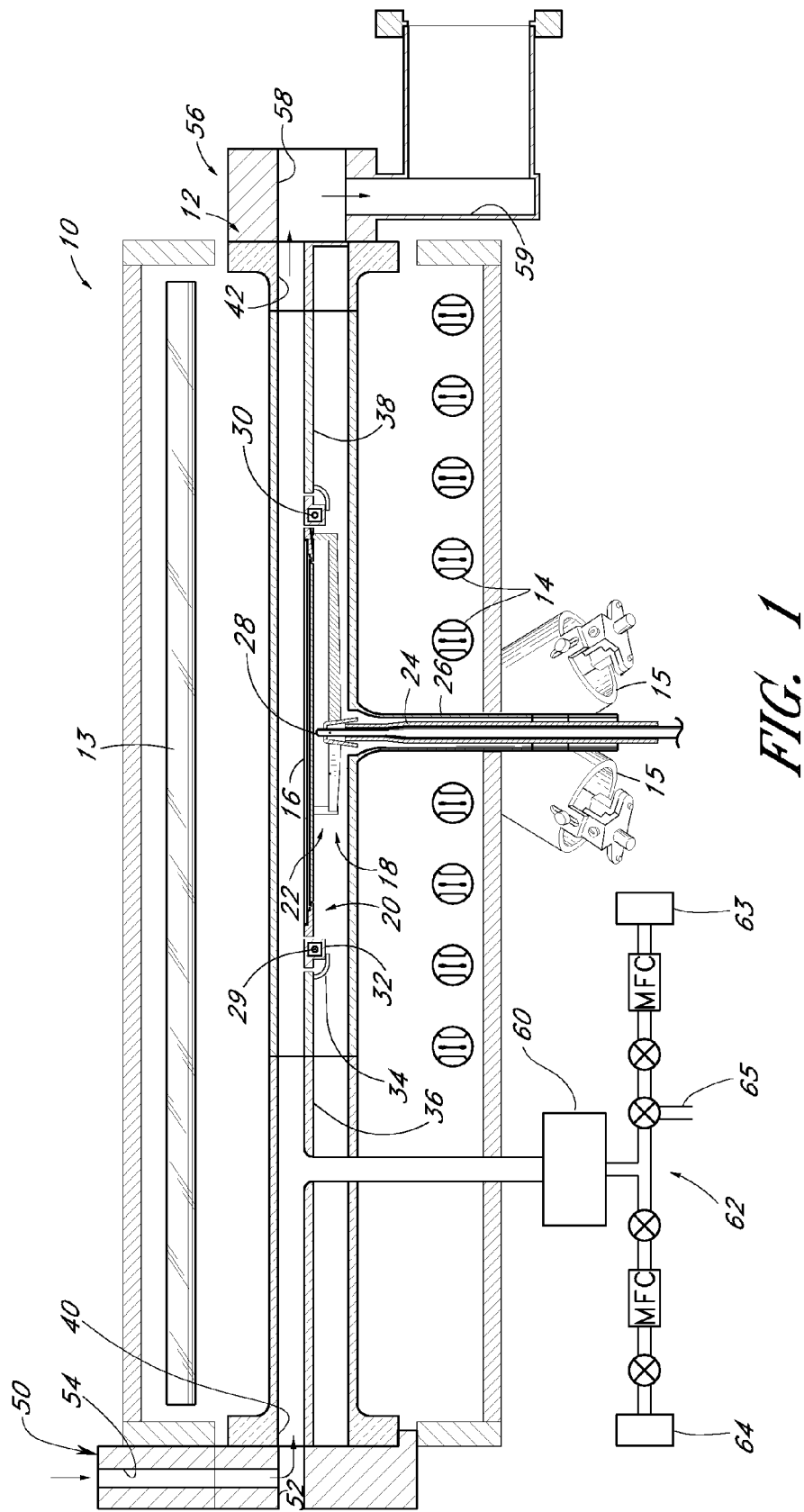
FIG. 1 is a schematic sectional view of an exemplary single-substrate process chamber for use with preferred embodiments of the invention.

According to preferred embodiments of the invention, a liquid injector and liquid precursor comprising trisilane are provided for use in semiconductor processing. The liquid injector, which can inject a liquid into a process chamber, preferably also vaporizes the liquid, thereby injecting it as a vapor into the process chamber. The liquid is preferably trisilane, which, as discussed below, has been discovered to have exceptional deposition properties that allow for the formation of highly uniform and conformal layers, particularly silicon-containing semiconductor layers.

Notably, the liquid state of trisilane at room temperature and atmospheric pressures permits it to be mixed with other liquid precursors, such as dopants that are also liquid under standard conditions. By use of trisilane and delivery of trisilane and/or trisilane in mixtures with other precursors directly into a process chamber with the liquid injector, a bubbler system is not needed. Advantageously, more uniform and conformal silicon-containing layers can be achieved, since, in conjunction with the superior deposition behavior of trisilane, the liquid injector further allows the formation of high quality silicon-containing layers by allowing the precursors to be more precisely metered as a liquid, rather than as a gas.

Trisilane

Manufacturers of microelectronic devices have long used silane ($SiH_4$) in CVD processes to deposit silicon-containing films. Because silane is a gas at room temperature and atmospheric pressure, it has been desirable as a silicon precursor due to, among other things, its chemical stability and the relatively uncomplicated systems required to deliver it to a process chamber. Nevertheless, silane has been found to have numerous shortcomings, as discussed below.

It will be appreciated that in the manufacturing context, well-controlled and reproducible deposition processes are highly desirable in order to maximize device yields and production rates. Moreover, it is generally desirable for the deposited films to be as uniform as possible in both thickness and elemental composition. Existing processes using silane, due to certain limitations of silane, however, tend to produce films that are non-uniform to varying degrees.

In particular, it has been found that dynamic temperature variations, resulting from limitations in heating and temperature control systems, play a significant role in the non-uniformity of films deposited on substrate surfaces by CVD. The surface temperature of the substrate has been found to influence the deposition rate and the composition of the resulting film, particularly at temperatures below approximately 650° C. Thus, temperature variations across the surface of the substrate can cause variations in deposition rates, which in turn can cause thickness variations in deposited films.

These temperature variations can be caused by several factors. For example, temperatures can change as deposition progresses, since temperature controls are often dependent upon the exposed surface of the substrate. Also, temperature variations of SiC-coated graphite components (e.g., pre-heat rings and susceptors) in single wafer, horizontal gas flow, cold wall reactors can contribute to temperature and film non-uniformities. Moreover, imperfect control over other process parameters, including gas flow rates and total pressure, are also believed to contribute to non-uniformities in film physical properties.

Because of variations in these process variables, the rate of deposition at any particular instant can vary as a function of position on the substrate, resulting in thickness variations in the film deposited across the surface of the substrate. Similarly, for multi-component films, the composition of the film being deposited at any particular instant in time varies from place to place across the surface of the substrate. Without being limited by theory, such variation can be a direct consequence of the difference in dissociative absorption activation energy that exists between the precursors used to introduce each of the elemental components of the multi-component film, i.e., different precursors used in forming a compound can deposit at differing rates and have deposition rates with differing sensitivities to temperature variations. As a result, the averaging-out/tuning approaches discussed below do not necessarily solve the problem of compositional non-uniformity.

The problems with thickness and compositional non-uniformity can cause several practical problems. Significant variations in the thickness and/or composition of the silicon-containing films during the manufacturing process can lead to lower manufacturing yields when the affected devices do not meet the required performance specifications or standards. Also, variations across the film within a particular device can reduce device performance and/or reliability. In many cases, these problems are exacerbated because manufacturing involves depositing silicon-containing films during the process of making thousands or even millions of devices simultaneously on a relatively large wafer, making uniformity harder to maintain across increasing surface areas. As noted above, the industry is currently transitioning from 200 mm to 300 mm wafers, which can contain even greater numbers of electrical devices. In the future, even larger wafers, accommodating even more devices, may be used.

One technique for addressing the above-described problems and to mitigate thickness non-uniformity is to deposit relatively thick films after reaction conditions have been empirically tuned. This approach relies on the fact that thickness non-uniformities tend to average out over the deposition time of any particular layer. Reactor process variables such as temperature and placement of heating lamps, gas flow rate, gas pressure, gas composition, etc. can be tuned to average out the total film thickness, particularly in single-wafer systems with rotating wafer supports.

Tuning involves depositing a large number of films, each under a different pre-selected set of deposition conditions. The thickness variations within each film are then measured and the results analyzed to identify conditions that reduce or eliminate the thickness variations.

Such empirical compensation has been found to have numerous shortcomings. For example, heavy expense is undesirably incurred due to the time and test wafers necessary to carry out this iterative process. Moreover, tuning does not necessarily produce uniform temperatures across the substrate throughout the deposition process. Rather, the result of the tuning process is to time-average the thickness variations produced by the temperature variations for a specific reaction temperature "set point," i.e., the target substrate temperature at which the process chamber apparatus is set. At a particular set-point, however, the temperatures across the surface of a substrate can still fluctuate.

This, in turn, raises the issue of compositional variation because compositional control is desired in three dimensions, both across the film surface and through the film thickness. For example, many films contain dopants and the level of these dopants influences the electronic properties of the film. Non-uniform temperatures can result in non-uniform incorporation of dopants or other reactants at a given depth of the film, whether homogeneous or graded doping is desired.

The problem of deposition non-uniformity is particularly acute when depositing very thin silicon-containing films. The ability to produce thin films is becoming more important as circuit dimensions shrink and the resulting devices become more compact. However, the averaging-out/tuning approaches described above are becoming increasingly inadequate because the deposition process time for a thin film is generally shorter than for a thick film, allowing less time for film thickness to average-out. In addition, highly compact devices are more sensitive to compositional non-uniformities, a problem that is not adequately addressed by averaging-out reactor tuning.

In addition to the complications introduced by variable process conditions, film uniformity in thin films is also affected by nucleation phenomena. These nucleation phenomena are not completely understood, but deposition by CVD with silane has been observed to occur by a process in which a number of separate silicon islands initially form on the surface of the substrate. As the deposition proceeds, these islands tend to grow until they contact one another, eventually forming a continuous silicon film. At this point the silicon film typically has a rough surface with peaks that correspond to the initial nucleation sites and valleys that correspond to the areas between nucleation sites. As deposition proceeds further and the film thickens, thickness uniformity increases by an averaging-out process similar to that described above.

Thin, continuous silicon-containing films, however, are generally very difficult to prepare by existing silane deposition processes because the film can reach the desired thickness in the regions near the peaks of the islands before the islands have grown together to form a continuous film. These problems are exacerbated for thinner films and by the surface mobility of atoms in amorphous films. Continuity problems are typically observed when using silane to deposit films having a thickness of about 200 Å or less, and even more so for films having a thickness of less than about 100 Å. These problems are also exacerbated as the surface area of the film increases. Serious difficulties are often encountered for very thin films having a surface area of about one square micron or greater, and even more so for very thin films having a surface area of about 5 square microns or greater. The nature of the substrate can also complicate silane deposition in that the substrate surface influences nucleation and growth. Thus, for example, the deposition of very thin continuous silicon-containing films over patterned dielectric substrates using silane is particularly challenging, especially for amorphous films.

In light of the above-discussed limitations of conventional deposition processes and precursors, it has been discovered that trisilane ($H_3SiSiH_2SiH_3$ or $Si_3H_8$) offers substantial benefits when used as a silicon source, as disclosed in U.S. application Ser. No. 10/074,564, filed Feb. 11, 2002, and published PCT Application WO 02/064,853, published Aug. 2, 2002, the disclosures of which are hereby incorporated by reference in their entirety. For example, film deposition methods utilizing trisilane have now been discovered that are much less sensitive to temperature variations across the surface of the substrate. Moreover, deposition rates with trisilane increase substantially linearly with the rate of flow of trisilane into the deposition chamber and are relatively insensitive to substrate material and thickness. Also, trisilane has an extremely short film nucleation time, which reduces the size of localized crystalline deposits of silicon. As a result, deposited silicon films can be made thinner, while still being uniform. Moreover, the films will show reduced surface roughness due to the reduced size of the localized silicon deposits.

In addition, with regards to process throughput, trisilane exhibits higher deposition rates relative to silane. Significantly, trisilane also reduces thermal budgets, since it allows use of lower process temperatures than does silane.

Thus, employing trisilane in the deposition systems and methods described herein provides numerous advantages. For example, these systems and methods allow the production of silicon-containing films that are uniformly thin and continuous. These advantages, in turn, enable devices to be produced in higher yields, and also enable the production of new devices having smaller circuit dimensions and/or higher reliability. These and other advantages are discussed in U.S. application Ser. Nos. 10/074,564, 10/074,633, 10/074,563, and 10/623,482, all of which are incorporated by reference in their entireties.

Deposited Silicon-containing Layers

Desirably, preferred silicon-containing films formed with trisilane have a thickness that is highly uniform across the surface of the film. Preferably, the thickness non-uniformity is about 20% or less, more preferably about 10% or less, even more preferably about 5% or less, most preferably about 2% or less.

It will be appreciated that film thickness uniformity is preferably determined by making multiple-point thickness measurements, e.g., by ellipsometry or cross-sectioning, determining the mean thickness by averaging the various thickness measurements, and determining the rms (root mean squared) variability. To enable comparisons over a given surface area, the results can be expressed as percent non-uniformity, calculated by dividing the rms thickness variability by the average thickness and multiplying by 100 to express the result as a percentage. Suitable methods for measuring film thickness include multiple-point ellipsometric methods. Instruments for measuring film thickness are well known and commercially available. Preferred instruments include the NanoSpec® series of instruments from Nanometrics, Inc., Sunnyvale, Calif. The thickness of a silicon-containing film can also be determined by cross-sectioning the substrate and measuring the thickness by an appropriate microscopy technique, most preferably by electron microscopy. The span over which a thickness is measured can be any span in the range of from about 10 times the thickness of the film to the entire span of the silicon-containing film. If the film thickness varies over the span, then the thickness is considered to be the average thickness, i.e., the numerical average of the thickest and thinnest dimensions of the film over a given span.

As used herein, rms (more properly, the square root of the mean squared error) is a way of expressing the amount of variability exhibited by the members of a given population. For example, in a group of objects having an average weight of y grams, each member of the group has a weight y' that differs from the average by some amount, expressed as (y'−y). To calculate rms, these differences are squared (to ensure that they are positive numbers), summed together, and averaged to yield a mean squared error. The square root of the mean squared error is the rms variability.

In addition to thickness uniformity, preferred silicon-containing films preferably provide a conformal coating over varied topography. A conformal coating is a layer that follows the curvature, if any, of the structure that it overlies. The conformal silicon-containing films preferably exhibit good step coverage even at relatively high aspect ratios. "Step coverage" refers to the thickness uniformity of a conformal film that overlies a stepped surface. A stepped surface is a surface that has two or more parallel components that are not disposed in the same horizontal plane. Step coverage is preferably determined by measuring the average thickness of the film at the bottom of the step, dividing it by the average thickness at the top of the step, and multiplying by 100 to express the result in percentage terms. "Aspect ratio" refers to the ratio of the vertical height of the step to the horizontal width of the structure.

At an aspect ratio in the range of about 4.5 to about 6, preferred silicon-containing films have a step coverage of about 70% or greater, more preferably 80% or greater. At an aspect ratio in the range of about 1 to about 4, preferred silicon-containing films have a step coverage of about 80% or greater, more preferably 90% or greater. Step coverage is preferably calculated as stated above, but can also be calculated by taking into account sidewall thicknesses. For example, alternate definitions of step coverage involve the ratio of the sidewall thickness to the average thickness at the top and/or bottom of the step. However, unless otherwise stated, step coverage herein is determined as stated above by measuring the average thickness of the horizontal portions of the silicon-containing film at the bottom of the step, dividing it by the average thickness of the horizontal portions at the top of the step, and multiplying by 100 to express the result in percentages.

In addition to thickness uniformity and high conformality, the surface smoothness and thickness of the preferred silicon-containing films can advantageously be maintained over a surface area of about one square micron ($\mu m^2$) or greater, more preferably about 5 $\mu m^2$ or greater, even more preferably about 10 $\mu m^2$ or greater. The silicon-containing film can cover all or part of a large substrate, e.g., a wafer, and thus can have a surface area of about 300 $cm^2$ or greater and preferably about 700 $cm^2$ or greater.

Since good step coverage is usually achieved, in many cases the surface roughness of the silicon-containing film is substantially the same as the roughness of the surface that it overlies. Surface roughness is preferably rms surface roughness as measured by atomic force microscopy (AFM) on a 1 micron×1 micron portion of the surface in question. The roughness of the underlying substrate surface can range from about 1 Å rms (atomically flat surface) up to about 25 Å rms or even higher. Preferably, the underlying substrate surface has a roughness of 10 Å rms or less, more preferably 5 Å rms or less, so that the overlying silicon-containing film has a comparable roughness. For an underlying substrate surface having a given degree of roughness, the silicon-containing film deposited thereon preferably has a surface roughness that is greater than the substrate surface roughness by an amount of about 5 Å or less, more preferably about 3 Å or less, even more preferably about 2 Å or less. For example, if the substrate surface roughness is about 7 Å rms, then the measured surface roughness of the silicon-containing film deposited thereon is preferably about 12 Å rms (7 Å+5 Å) or less. Preferably, the underlying surface has a roughness of about 2 Å rms or less and the overlying silicon-containing film has a measured surface roughness of about 5 Å rms or less, more preferably about 3 Å rms or less, most preferably about 2 Å rms or less.

It will be appreciated that silicon-containing layers can be formed using the methods and systems disclosed herein in conjunction with various deposition methods known to those skilled in the art. For example, the disclosed methods can suitably be practiced by employing CVD, including plasma-enhanced chemical vapor deposition (PECVD) or thermal CVD, utilizing vaporized trisilane to deposit a silicon-containing film onto a substrate contained within a CVD chamber. Thermal CVD is preferred for silicon deposition using trisilane or the trisilane mixtures described below.

Preferred Reactor

While the preferred embodiments can be used with other reactors known to those of skill in the art, use of a single-substrate, horizontal flow cold-wall reactor is particularly advantageous. For example, the single-pass horizontal flow design illustrated in FIG. 1 enables laminar flow of reactant gases with low residence times, which in turn facilitates rapid sequential processing while minimizing reactant interaction with each other and with chamber surfaces. Such a laminar flow enables sequentially flowing reactants that might react with each other. Reactions to be avoided include highly exothermic or explosive reactions, such as produced by oxygen and hydrogen-bearing reactants, and reactions that produce particulate contamination of the chamber.

FIG. 1 shows a chemical vapor deposition (CVD) reactor 10, including a quartz process or reaction chamber 12, constructed in accordance with a preferred embodiment, and for which the methods disclosed herein have particular utility. The superior processing control of the reactor 10 has utility in CVD of a number of different materials and can safely and cleanly accomplish multiple treatment steps sequentially in the same chamber 12. The basic configuration of the reactor 10 is available commercially under the trade name Epsilon™ from ASM America, Inc. of Phoenix, Ariz.

A plurality of radiant heat sources are supported outside the chamber 12 to provide heat energy in the chamber 12 without appreciable absorption by the quartz chamber 12 walls. The illustrated radiant heat sources comprise an upper heating assembly of elongated tube-type radiant heating elements 13. The upper heating elements 13 are preferably disposed in spaced-apart parallel relationship and also substantially parallel with the reactant gas flow path through the underlying process chamber 12. A lower heating assembly comprises similar elongated tube-type radiant heating elements 14 below the process chamber 12, preferably oriented transverse to the upper heating elements 13. Desirably, a portion of the radiant heat is diffusely reflected into the chamber 12 by rough specular reflector plates above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the process chamber 12.

Each of the elongated tube type heating elements 13, 14 is preferably a high intensity tungsten filament lamp having a transparent quartz envelope containing a halogen gas, such as iodine. Such lamps produce full-spectrum radiant heat energy transmitted through the walls of the process chamber 12 without appreciable absorption. As is known in the art of semiconductor processing equipment, the power of the various lamps 13, 14, 15 can be controlled independently or in grouped zones in response to temperature sensors. The skilled artisan will appreciate, however, that the principles and advantages of the processes described herein can be achieved with other heating and temperature control systems.

A substrate, preferably comprising a silicon wafer 16, is shown supported within an interior volume of the process chamber 12 upon a substrate support structure 18. Note that, while the substrate of the illustrated embodiment is a single-crystal silicon wafer, it will be understood that the term "substrate" broadly refers to any surface on which a layer is to be deposited. Moreover, thin, uniform layers are often required on other types of workpieces, including, without limitation, the deposition of optical thin films on glass.

The illustrated support structure 18 includes a substrate holder 20, upon which the wafer 16 rests, and which is in turn supported by a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12.

A plurality of temperature sensors are positioned in proximity to the wafer 16. The temperature sensors can take any of a variety of forms, such as optical pyrometers or thermocouples. The number and positions of the temperature sensors are selected to promote temperature uniformity, as will be understood in light of the description below of the preferred temperature controller. In the illustrated reactor 10, the temperature sensors directly or indirectly sense the temperature of positions in proximity to the wafer.

In the illustrated embodiment, the temperature sensors comprise thermocouples, including a first or central thermocouple 28, suspended below the wafer holder 20 in any suitable fashion. The illustrated central thermocouple 28 passes through the spider 22 in proximity to the wafer holder 20. The reactor 10 further includes a plurality of secondary or peripheral thermocouples, also in proximity to the wafer 16, including a leading edge or front thermocouple 29, a trailing edge or rear thermocouple 30, and a side thermocouple (not shown). Each of the peripheral thermocouples is housed within a slip ring 32, which surrounds the substrate holder 20 and the wafer 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat during high temperature processing, such that it compensates for a tendency toward greater heat loss or absorption at wafer edges, a phenomenon which is known to occur due to a greater ratio of surface area to volume in regions near such edges. By minimizing edge losses, the slip ring 32 can reduce the risk of radial temperature non-uniformities across the wafer 16. The slip ring 32 can be suspended by any suitable means. For example, the illustrated slip ring 32 rests upon elbows 34 which depend from a front chamber divider 36 and a rear chamber divider 38. The dividers 36, 38 desirably are formed of quartz. In some arrangements, the rear divider 38 can be omitted.

The illustrated process chamber 12 includes an inlet port 40 for the injection of reactant and carrier gases, and the wafer 16 can also be received therethrough. An outlet port 42 is on the opposite side of the chamber 12, with the wafer support structure 18 positioned between the inlet 40 and outlet 42.

An inlet component 50 is fitted to the process chamber 12, adapted to surround the inlet port 40, and includes a horizontally elongated slot 52 through which the wafer 16 can be inserted. A generally vertical inlet 54 is in fluidic communication with remote precursor sources, as will be described more fully with respect to FIG. 2, and communicates such precursors with the slot 52 and the inlet port 40. The inlet 54 can include gas injectors as described in U.S. Pat. No. 5,221, 556, issued to Hawkins et al., or as described with respect to FIGS. 21-26 in U.S. Pat. No. 6,093,252, issued to Wengert et al., the disclosures of which are hereby incorporated by reference. Such gas injectors are designed to maximize uniformity of gas flow for the single-wafer reactor.

Figure 2:
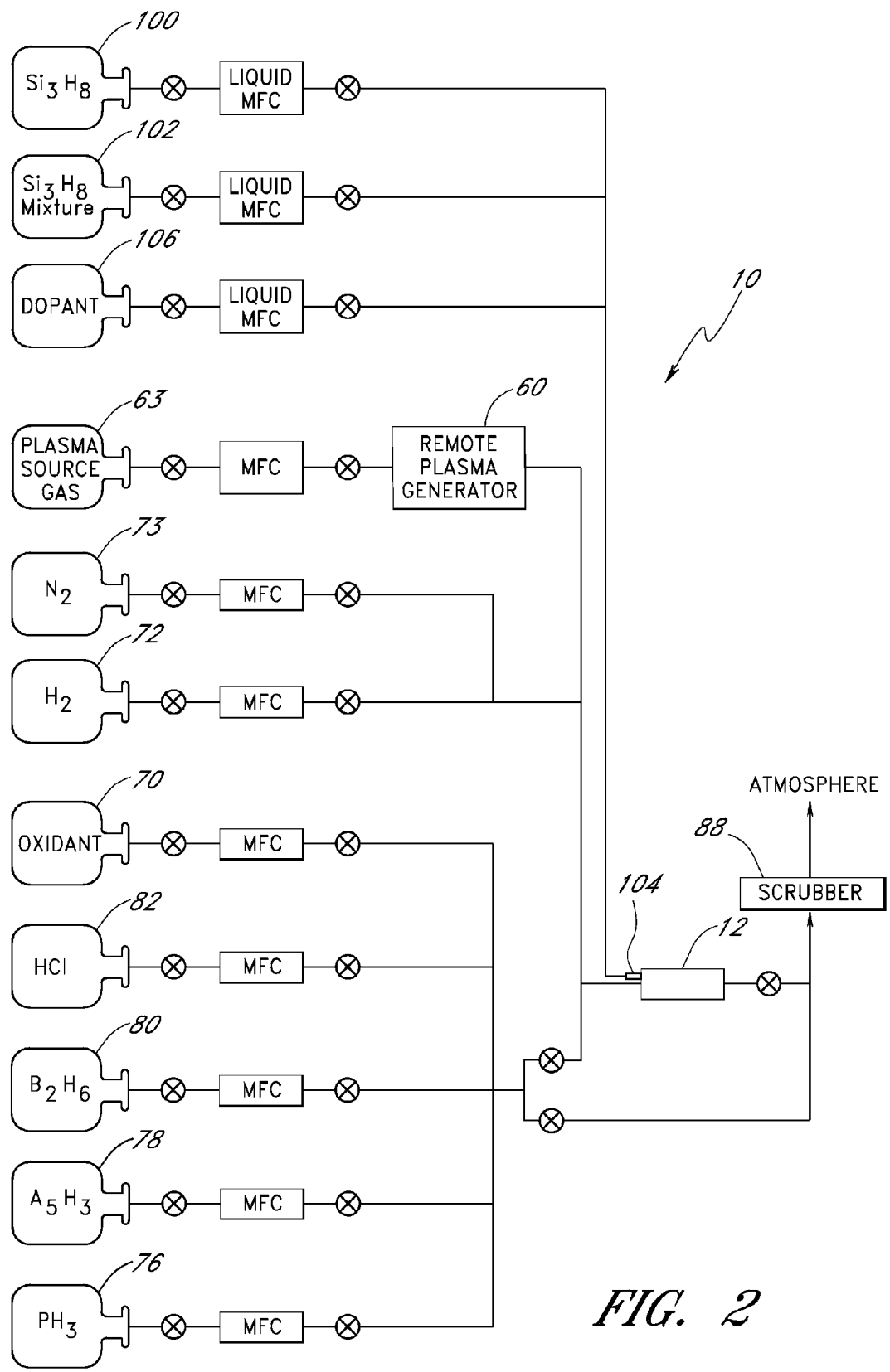
FIG. 2 is a gas flow schematic, illustrating exemplary reactant and inert gas sources in accordance with preferred embodiments of the invention.

An outlet component 56 similarly mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the process chamber 12 and a downstream scrubber 88 (FIG. 2). A pump or fan is preferably included to aid in drawing process gases through the chamber 12, and to evacuate the chamber for low pressure processing.

The preferred reactor 10 also includes a source 60 of excited species, preferably positioned upstream from the chamber 10. The excited species source 60 of the illustrated embodiment comprises a remote plasma generator, including a magnetron power generator and an applicator along a gas line 62. An exemplary remote plasma generator is available commercially under the trade name TRW-850 from Rapid Reactive Radicals Technology (R3T) GmbH of Munich, Germany. In the illustrated embodiment, microwave energy from a magnetron is coupled to a flowing gas in an applicator along a gas line 62. A source of precursor gases 63 is coupled to the gas line 62 for introduction into the excited species generator 60. A separate source of carrier gas 64 can also be coupled to the gas line 62, though in embodiments employing $N_2$ as the nitrogen source, separate carrier gas can be omitted. One or more further branch lines 65 can also be provided for additional reactants. Each gas line can be provided with a separate mass flow controller (MFC) and valves, as shown, to allow selection of relative amounts of carrier and reactant species introduced to the generator 60 and thence into the process chamber 12.

Wafers are preferably passed from a handling chamber (not shown), which is isolated from the surrounding environment, through the slot 52 by a pick-up device. The handling chamber and the process chamber 12 are preferably separated by a gate valve (not shown), such as a slit valve with a vertical actuator, or a valve of the type disclosed in U.S. Pat. No. 4,828,224.

The total volume capacity of a single-wafer process chamber 12 designed for processing 200 mm wafers, for example, is preferably less than about 30 liters, more preferably less than about 20 liters, and most preferably less than about 10. The illustrated chamber 12 has a capacity of about 7.5 liters. Because the illustrated chamber 12 is divided by the dividers 32, 38, wafer holder 20, ring 32, and the purge gas flowing from the tube 26, however, the effective volume through which process gases flow is approximately half the total volume (about 3.77 liters in the illustrated embodiment). Of course, it will be understood that the volume of the single-wafer process chamber 12 can be different, depending upon the size of the wafers for which the chamber 12 is designed to accommodate. For example, a single-wafer process chamber 12 of the illustrated type, but for 300 mm wafers, preferably has a capacity of less than about 100 liters, more preferably less than about 60 liters, and most preferably less than about 30 liters. One 300 mm wafer process chamber has a total volume of about 24 liters, with an effective processing gas capacity of about 11.83 liters. The relatively small volumes of such chambers desirably allow rapid evacuation or purging of the chamber between phases of the cyclical process described below.

FIG. 2 shows a gas line schematic, in accordance with preferred embodiments. The reactor 10 is provided with a liquid trisilane source 100 comprising the preferred silicon source or precursor. In other embodiments, as discussed in greater detail below, the reactor 10 is preferably provided with a liquid trisilane mixture 102 comprising trisilane and another precursor, such as a dopant for forming doped silicon films. Trisilane source 100 and mixture 102, with separate feed lines and injectors, are both shown in FIG. 2 for ease of description.

As also shown in FIG. 2, the reactor 10 further includes a source 72 of hydrogen gas ($H_2$). As is known in the art, hydrogen is a useful carrier gas and purge gas because it can be provided in very high purity, due to its low boiling point, and is compatible with silicon deposition.

The preferred reactor 10 also includes a source 73 of nitrogen gas ($N_2$). As is known in the art, $N_2$ is often employed in place of $H_2$ as a carrier or purge gas in semiconductor fabrication. Nitrogen gas is relatively inert and compatible with many integrated materials and process flows. Other possible carrier gases include noble gases, such as helium (He) or argon (Ar).

The reactor 10 can also be provided with a source 70 of oxidizing agent or oxidant. The oxidant source 70 can comprise any of a number of known oxidants, particularly a volatile oxidant such as $O_2$, NO, $H_2O$, $N_2O$, HCOOH, $HClO_3$.

Desirably, the reactor 10 will also include other source gases such as dopant sources (e.g., the illustrated phosphine 76, arsine 78 and diborane 80 sources) etchants for cleaning the reactor walls and other internal components (e.g., HCl source 82 or $NF_3/Cl_2$ (not shown) provided through the excited species generator 60).

Each of the gas sources can be connected to the inlet 54 (FIG. 1) via gas lines with attendant safety and control valves, as well as mass flow controllers ("MFCs"), which are coordinated at a gas panel. Precursors are communicated to the inlet 54 (FIG. 1) in accordance with directions programmed into a central controller and distributed into the process chamber 12 through injectors. After passing through the process chamber 12, unreacted process gases and gaseous reaction by-products are exhausted to a scrubber 88 to condense environmentally dangerous fumes before exhausting to the atmosphere.

As discussed above, in addition to conventional gas sources, the illustrated reactor 10 includes the excited species source 60 positioned remotely or upstream of the process chamber 12. The illustrated source 60 couples microwave energy to gas flowing in an applicator, where the gas includes reactant precursors from the reactant source 63. A plasma is ignited within the applicator, and excited species are carried toward the chamber 12. Preferably, of the excited species generated by the source 60, overly reactive ionic species substantially recombine prior to entry into the chamber 12. On the other hand, N radicals can survive to enter the chamber 12 and react as appropriate.

Additionally, the plasma can be generated in situ, in the process chamber 12. Such an in situ plasma, however, may cause damage, uniformity and roughness problems with some deposited layers. Consequently, where a plasma is used, a remotely generated plasma is typically preferred.

The trisilane or the trisilane mixtures are preferably introduced into the process chamber 12 (FIG. 1) by a direct liquid injector 104, as discussed below. For depositing silicon-containing layers, the total pressure in the process chamber 12 (FIG. 1) is preferably in the range of about 0.001 Torr to about 780 Torr, more preferably in the range of about 0.001 Torr to about 100 Torr, most preferably in the range of about 0.001

Torr to about 10 Torr. The partial pressure of trisilane is preferably in the range of about 0.0001% to about 100% of the total pressure, more preferably about 0.001% to about 50% of the total pressure.

Advantageously, deposition in the pressure range of 0.001 Torr to 10 Torr has been found to result in excellent uniformity. In addition, low partial pressures are generally desirable to maintain a lower hydrogen content during the process. Due to the inherently lower H:Si ratio in silanes with higher numbers of silicon atoms, however, the partial pressure for trisilane can be higher than that for lower order silanes, such as disilane and silane.

Preferably, deposition conditions are created to supply sufficient energy to pyrollize or decompose the silicon precursor at a hot substrate surface and deposit silicon at a rate that is controlled primarily by the rate at which it is delivered to the substrate surface. Thus, for precursors such as trisilane, deposition is also preferably conducted under chemical vapor deposition conditions that are in or near the mass transport limited regime. In the mass transport limited regime, deposition rates are essentially independent of temperature. This means that small temperature variations across the surface of the substrate have little or no effect on deposition rate. It has been found that deposition in the mass transport limited regime greatly minimizes thickness and compositional variations, due to reduced dependence upon strict temperature control, and enables the production of the preferred silicon-containing films described herein. Thus, advantageously, such conditions allow for deposition with minimal loading effects or pattern sensitivity.

Liquid Injection

Liquid precursors are typically delivered into a process chamber using a bubbler system in which a carrier gas is bubbled through a container holding the liquid precursor. As noted above, however, such systems can be imprecise, since the exact amount of a precursor delivered to the process chamber is dependent upon the particular precursor's volatility. Thus, precursor metering is indirectly controlled by regulating vaporization conditions and carrier gas flow. In addition, precursors with very low vapor pressures can condense in the space between the liquid precursor source and the process chamber or can decompose from heating mechanisms designed to keep the precursors vaporized.

Similarly, precursors that are solids under standard conditions are typically sublimed or melted and vaporized for delivery into a process chamber. The delivery of vapor from solid precursors is also vulnerable to the vapor pressure, condensation and decomposition complications discussed above. This imprecision in metering liquid or solid precursors can be especially problematic in the case of doped conductive or semiconducting films, which are particularly sensitive to doping level because the doping level influences the electrical and physical properties of the films.

Notwithstanding these difficulties, trisilane has traditionally been delivered to process chambers using bubbler systems because its low boiling point allows it to be relatively easily converted into and maintained in vapor form. Thus, bubbler systems have been considered to be acceptable for use with trisilane.

Trisilane, however, offers numerous advantages when used in conjunction with direct liquid injection systems. For example, because trisilane is a liquid, it can be metered directly as a liquid, rather than indirectly via vaporization conditions and carrier gas flow, thus allowing greater precision in controlling the amount of trisilane delivered to a process chamber.

Moreover, the imprecision of bubbler systems and gaseous metering of precursors is compounded when forming silicon-containing films, since different bubblers and flow controllers are typically used for each precursor. In contrast, by storing precise ratios of various precursors in a mixture with trisilane and maintaining the mixture in a liquid state through liquid flow controllers to the liquid injector, the mixture also can be more precisely metered as a pre-mixed liquid, in comparison to metering separate gaseous flows of precursors. Consequently, the use of liquid injection systems advantageously permits precise metering of the trisilane mixtures, which in turn can allow for, e.g., the formation of doped conductive or semiconducting layers with high compositional uniformity.

Moreover, because the flow rate of such mixtures is not dependent upon the amount of precursor picked up by, e.g., carrier gas flowing through a bubbler, precursor flow rates into a process chamber can be higher that those possible with a bubbler. The ability to deliver precursor to the process chamber at a higher rate allows higher deposition rates that is typically possible with a bubbler.

Advantageously, trisilane has a relatively low boiling point and, in most mixtures, will not be the constituent requiring the highest vaporization temperature. It will be appreciated that because a mixture is usually heated to the temperature of the boiling point of the precursor having the highest boiling point in order to effectively vaporize the entire mixture, the constituents of a mixture can be limited to precursors having similar boiling points. This is because lower-boiling point materials may decompose or form involatile residues or other undesirable by-products at the temperatures needed to vaporize a precursor with a higher boiling point. On the other hand, lowering the vaporization temperature may result in incomplete vaporization of some constituents, thus undermining the precision offered by using a precursor mixture. Unlike relatively high boiling point precursors such as tetraethyl orthosilicate (TEOS), however, trisilane may be used in mixtures with relatively low boiling point precursors without decomposing or otherwise forming undesirably by-products from the precursors. Moreover, if trisilane has the lowest boiling point of all liquids in a mixture, the vaporization temperature of a liquid injection system can be optimized for vaporizing the other constituents (e.g., dopant precursors) of a precursor mixture, thereby minimizing the formation of undesirable by-products caused by exposing those constituents to temperatures higher than their boiling point. Preferably, trisilane is mixed with precursors having a boiling point within about 60° C. and, more preferably, within about 40° C. of the boiling point of trisilane under process conditions.

For forming doped films, trisilane is preferably stored in a mixture with dopants that are also liquids under standard conditions. Exemplary liquid dopants include compounds that are not reactive with trisilane under the storage conditions utilized such as, phosphorus tribromide and phosphorous trichloride. More preferably, dopant sources include silylated dopant molecules containing As, P or B having the chemical formula $(H_3Si)_{3-x}MH_x$ where x=1-3 and M=As, P or B (if known to exist). Preferably, M=P or As and X=3.

Figure 3:
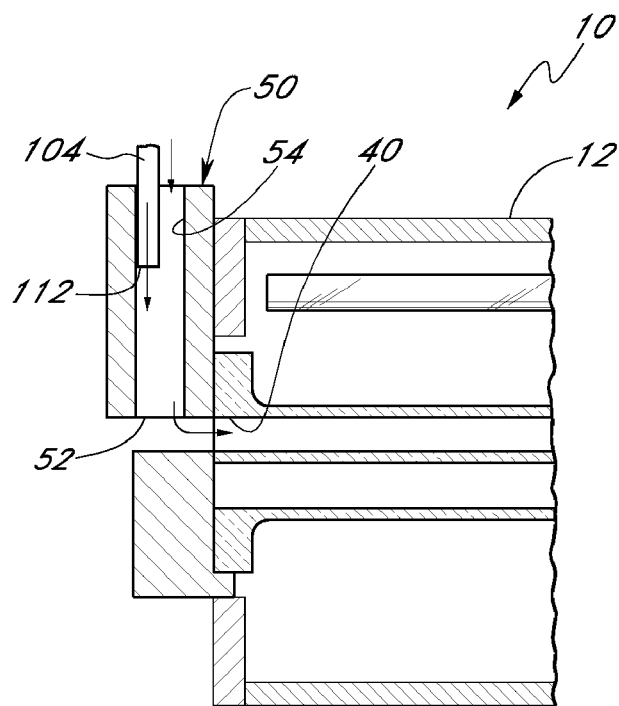
FIG. 3 is a schematic sectional view of an exemplary arrangement for connecting a liquid injector to the single-substrate process chamber of FIG. 1, in accordance with preferred embodiments of the invention.

With reference now to FIGS. 2 and 3, the trisilane mixture 102 is connected to and in liquid communication with a liquid injector 104, such that the mixture can flow to the liquid injector 104 in a liquid state. A liquid mass flow controller preferably meters the mixture between the source 102 and the liquid injector 104. The liquid injector 104 is preferably open to the inlet port 40. More preferably, to minimize modifications to existing processing systems, the liquid injector 104 has an outlet 112 that discharges into the generally vertical inlet 54, as shown in FIG. 3.

Figure 4:
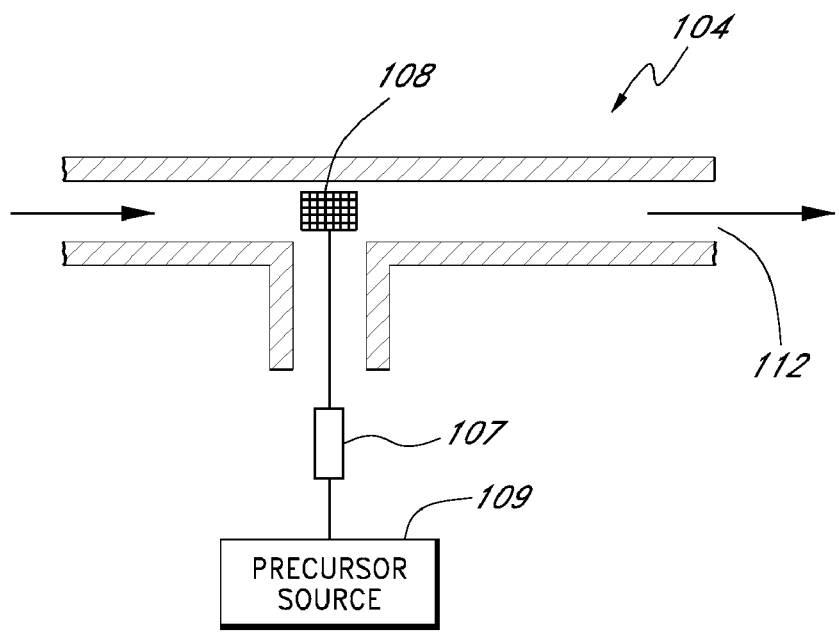
FIG. 4 is a schematic sectional view of an exemplary liquid injector, in accordance with preferred embodiments of the invention.
Figure 9:
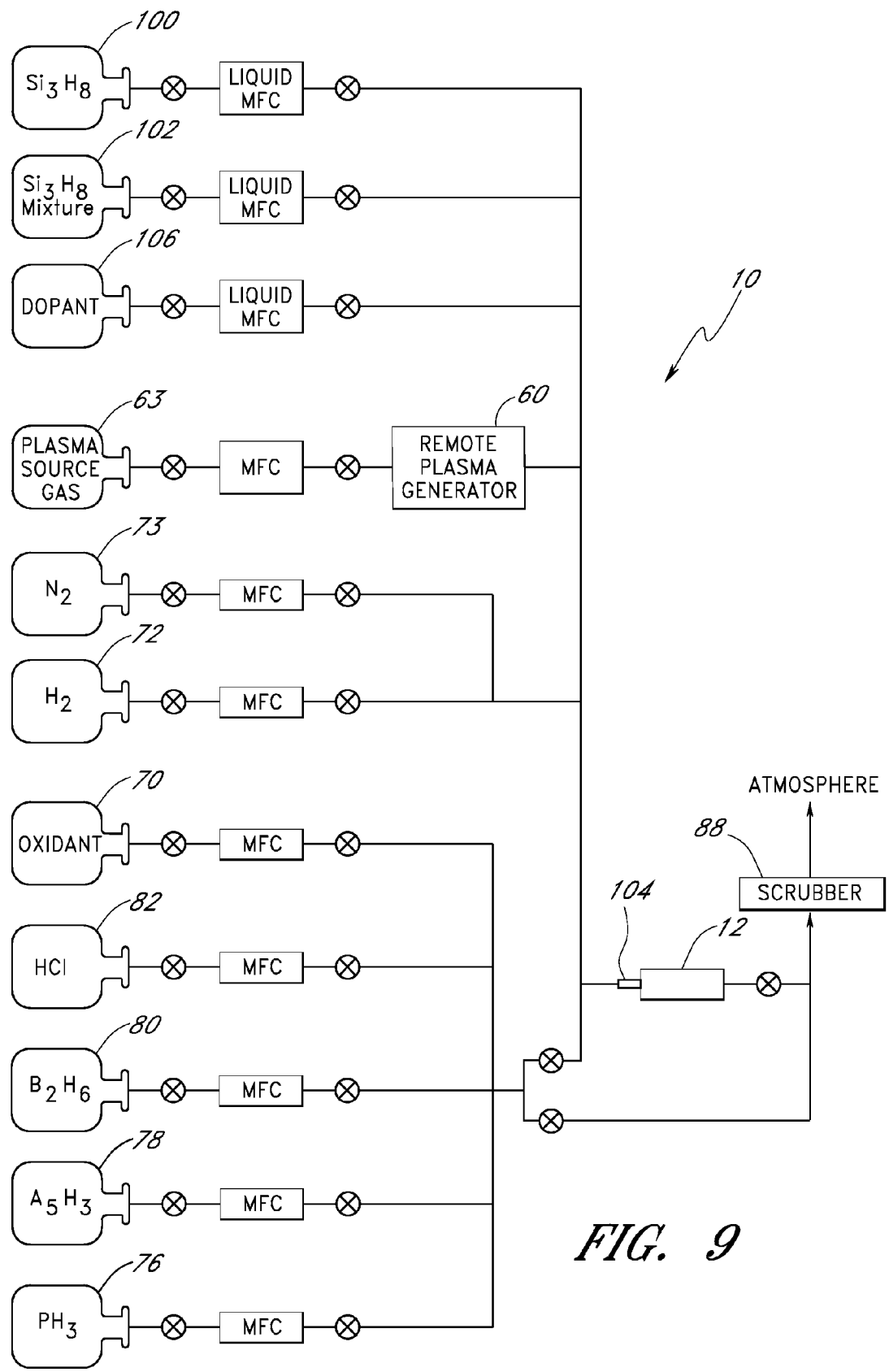
FIG. 9 is another gas flow schematic, illustrating exemplary reactant and inert gas sources in accordance with preferred embodiments of the invention.

The liquid injector 104 can be any of various injectors known in the art and is configured to discharge into the process chamber 12. For example, the liquid injector 104 can directly vaporize a liquid precursor stream by exposing the precursor stream to a surface hotter than the boiling point of the precursor (e.g., greater than about 53° C. at atmospheric pressure), or can include atomizers that first convert the liquid precursor to microdroplets before vaporizing the liquid precursor in microdroplet form. An exemplary liquid injector which directly vaporizes a liquid precursor is described in U.S. Pat. No. 5,204,314, issued to Kirlin et al. and illustrated in FIG. 4. A porous vaporization matrix 108 is connected to a precursor source 109, which can, for example, comprise any or all of the liquid precursor sources 100, 102 and 106 (FIGS. 2 and 9). The flow of precursor from the source 109 to the matrix 108 is regulated by the liquid mass flow controller 107. Liquid precursor is flowed into the porous vaporization matrix 108, e.g., a mesh or screen, which has been heated to a temperature sufficient to vaporize the liquid precursor when the precursor reaches the matrix. The matrix 108 is located in the flow path of a carrier gas, which carries the vaporized precursor into the chamber 12 via the inlet port 40 (see FIG. 1). It will be appreciated that the carrier gas can be any of various gases known in the art for carrying precursors into a process chamber, including, but not limited to, nitrogen and hydrogen from gas sources 73 and 72 (FIGS. 2 and 9).

In other embodiments, the liquid precursor can exit through an atomizer, which releases the precursor in the form of microdroplets. In one arrangement, the microdroplets are flowed directly into the process chamber 12, which has an atmosphere set at a temperature (e.g., greater than the boiling point of the precursor under the reaction conditions) high enough to vaporize the precursor mist. Preferably, the microdroplets exit the liquid injector 104 close to, or directly into the inlet port 40 in order to minimize the probability of condensation by minimizing the time that the precursor spends outside of the relatively hot interior of the process chamber 12. Such an arrangement can be particularly advantageous where trisilane is the only silicon precursor injected from the atomizer, since trisilane has a relatively low boiling point and, so, can be more easily vaporized.

Figure 5A:
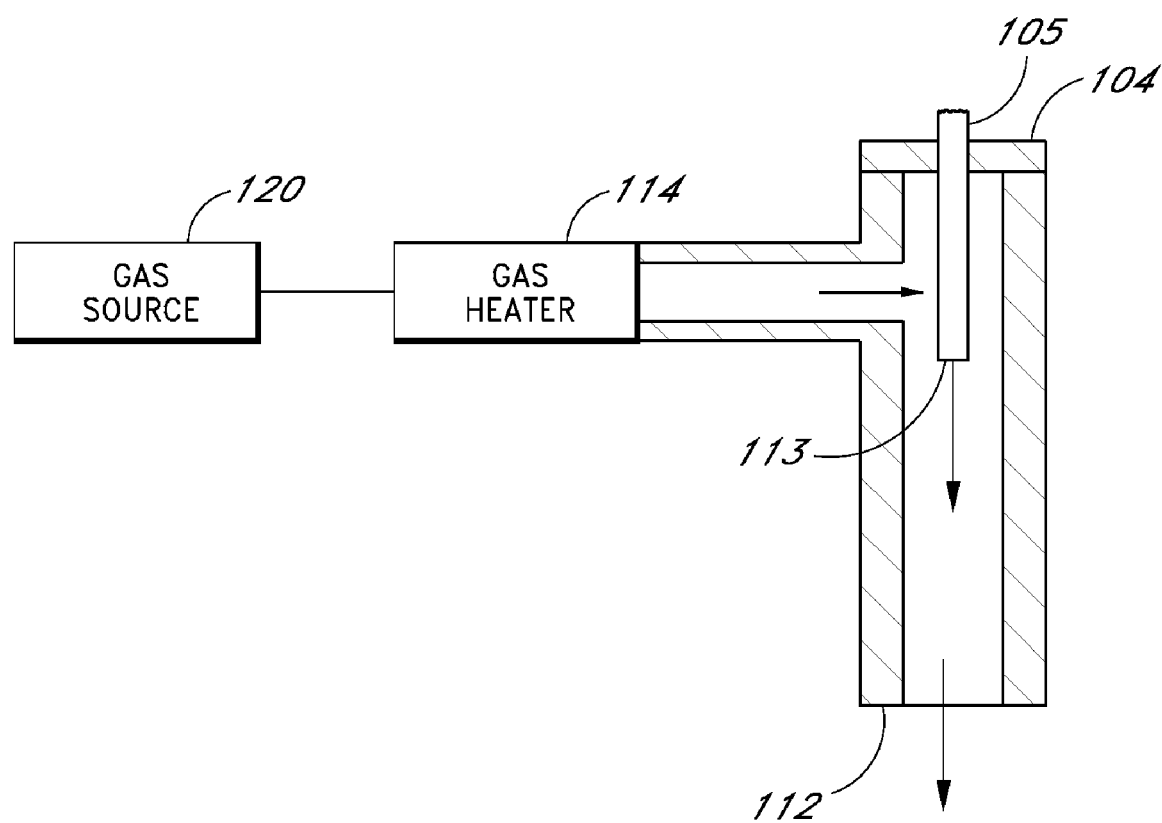
FIG. 5A is a schematic sectional view of another exemplary liquid injector, in accordance with preferred embodiments of the invention.

In another arrangement, shown in FIG. 5A, the injector 104 includes a gas heater 114 that heats a carrier gas, which is preferably an inert gas, from a gas source 120 to a temperature high enough to vaporize the microdroplets. Such an injector 104 is described in U.S. Pat. No. 6,244,575 B1, issued to Vaarstra et al. An atomizer 105 converts a liquid precursor into microdroplets, which exit the atomizer 105 via outlet 113. The gas from gas source 120 and heated by gas heater 114 contacts the microdroplets, vaporizing the microdroplets and carrying them into the process chamber 12. Because vaporization is dependent on contact with a pre-heated gas, the outlet of the injector 104 can be located farther from the process chamber 12 relative to configurations where contact with the high temperatures of the process chamber 12 itself causes vaporization. It will be appreciated that a liquid mass flow controller (FIG. 2) is upstream of the atomizer 105.

Figure 5B:
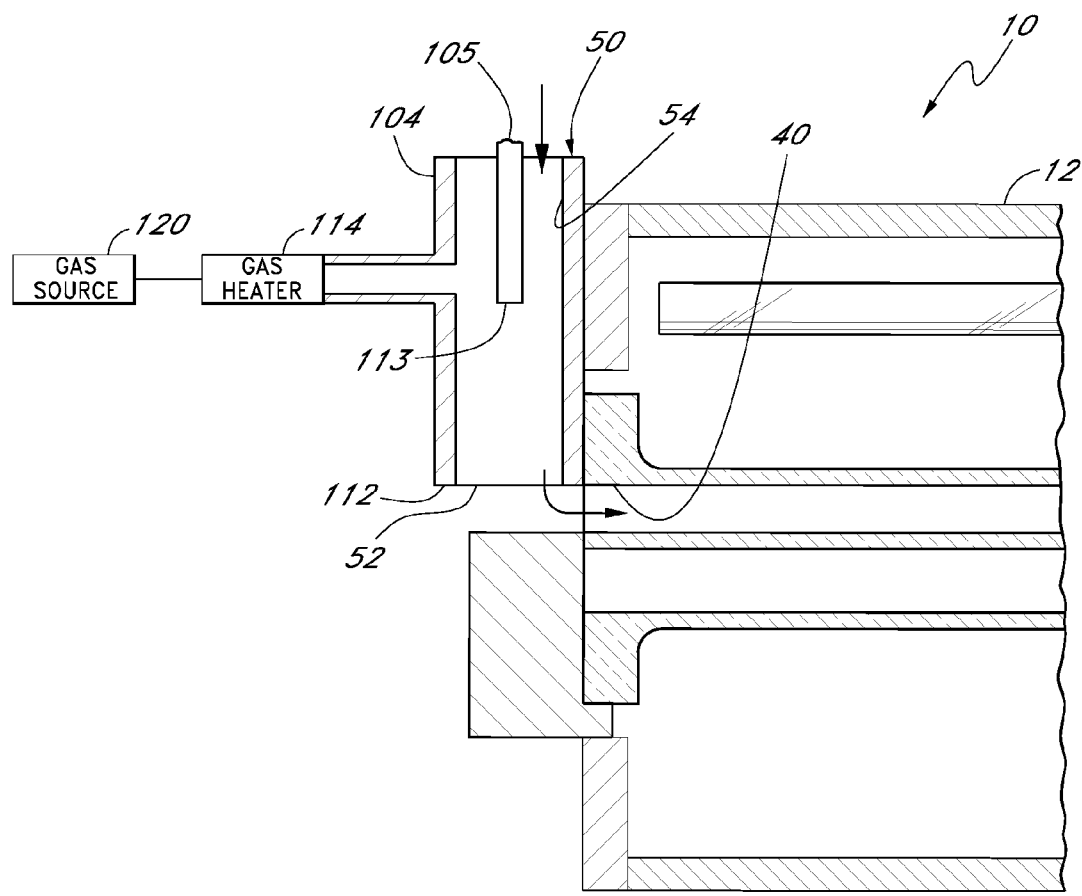
FIG. 5B is a schematic sectional view of another exemplary liquid injector, in accordance with preferred embodiments of the invention.

FIG. 5B shows another arrangement in which the generally vertical inlet 54 itself is part of the liquid injector 104. The atomizer 105 is downstream of a liquid mass flow controller (FIG. 2) and has an outlet 113 in the generally vertical inlet 54, which is connected to the gas heater 114, which in turn is connected to the gas source 120. In this arrangement, precursor microdroplets exit the atomizer 105 into the generally vertical inlet 54, where hot carrier gas heated by the gas heater 114 vaporizes the microdroplets and sweeps the precursor into the process chamber 12.

Figure 6:
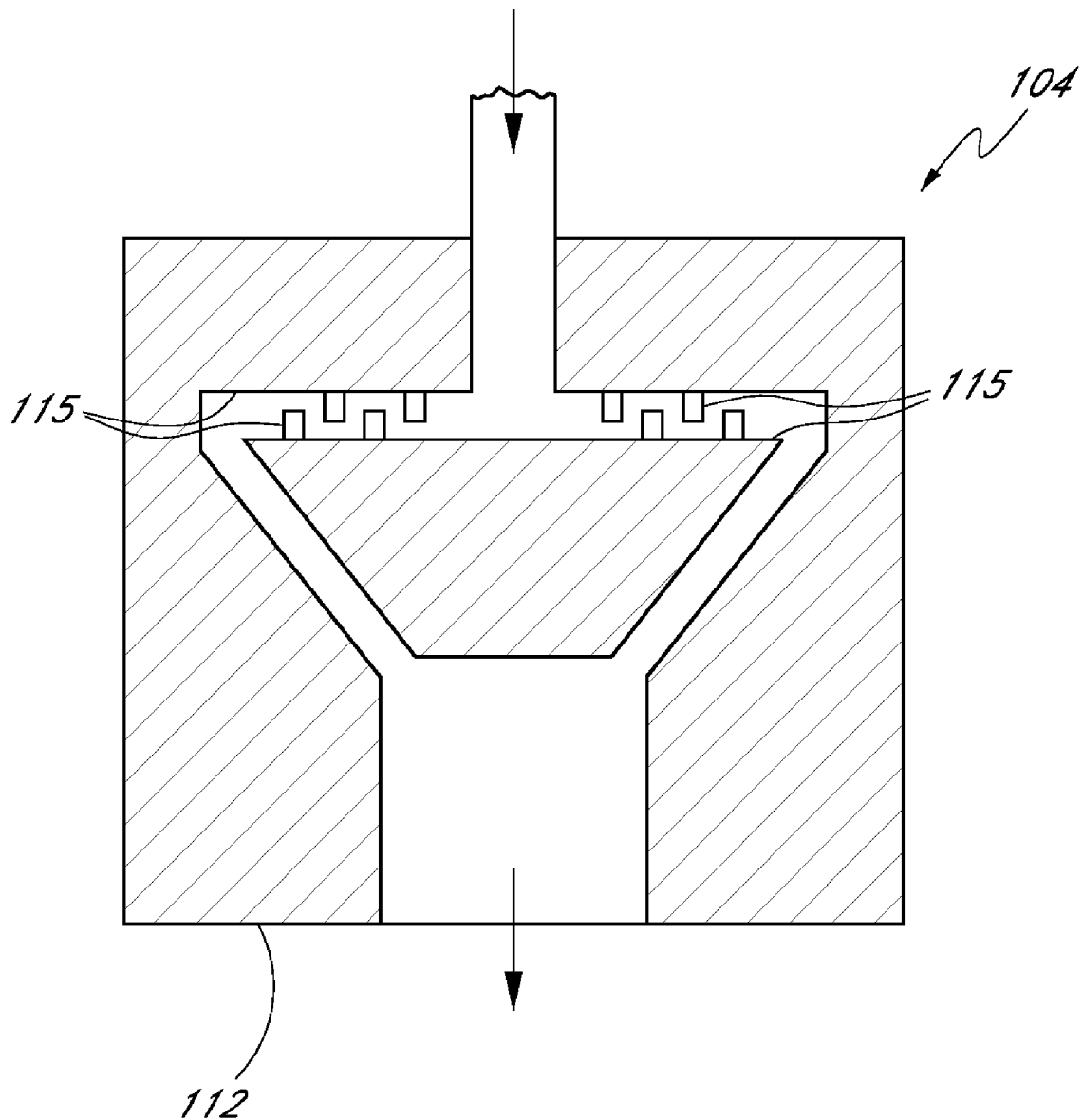
FIG. 6 is a schematic sectional view of another exemplary liquid injector, in accordance with preferred embodiments of the invention.

In other embodiments, the liquid precursor is vaporized by contacting a hot surface before entering the process chamber 12. The vaporized precursor is then carried by a carrier gas into the process chamber 12. In other embodiments, the volume expansion of the liquid itself in transitioning from a liquid into a vapor may be sufficient to drive newly formed vapor into the process chamber 12. An exemplary injector using this vaporization scheme is described in U.S. Pat. No. 6,082,714, issued to Dornfest et al. and shown in FIG. 6. Preferably, the hot surface 115 has a high surface area to maximize contact with the liquid precursor and to increase the efficiency of liquid precursor vaporization. As shown in FIG. 6, this can be accomplished by forming a convoluted path for precursor to flow.

Figure 7:
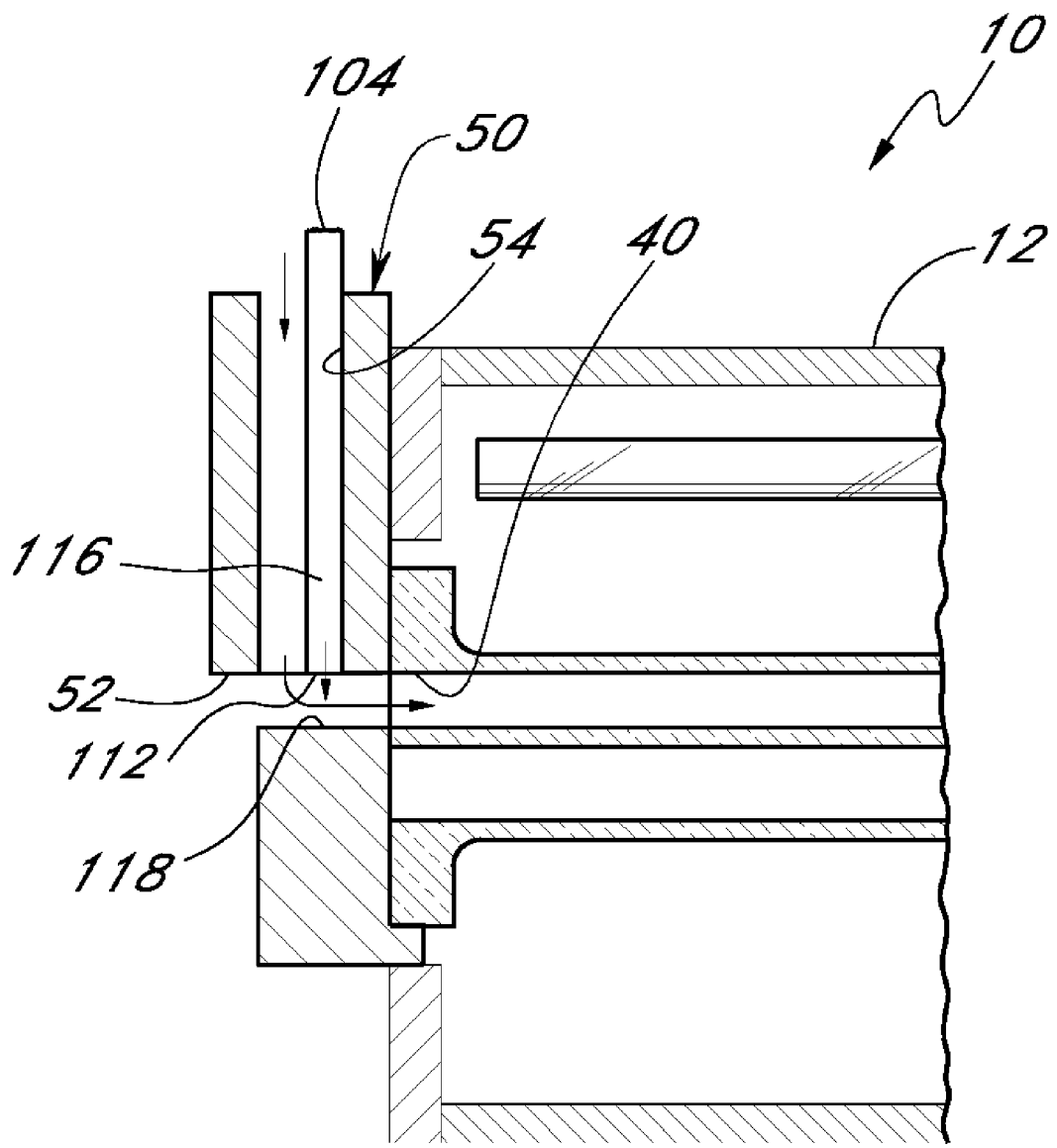
FIG. 7 is a schematic sectional view of another exemplary liquid injector, in accordance with preferred embodiments of the invention.

In other arrangements, the hot surface may be a wall of the process chamber 12, as shown in FIG. 7. In such cases, the injector 104 preferably comprises an atomizer 116 that directs precursor microdroplets to the hot surface 118 for vaporization. A carrier gas flowing through the generally vertical inlet 54 then carries the vaporized precursor to interact with the substrate 16 in the process chamber 12.

Figure 8:
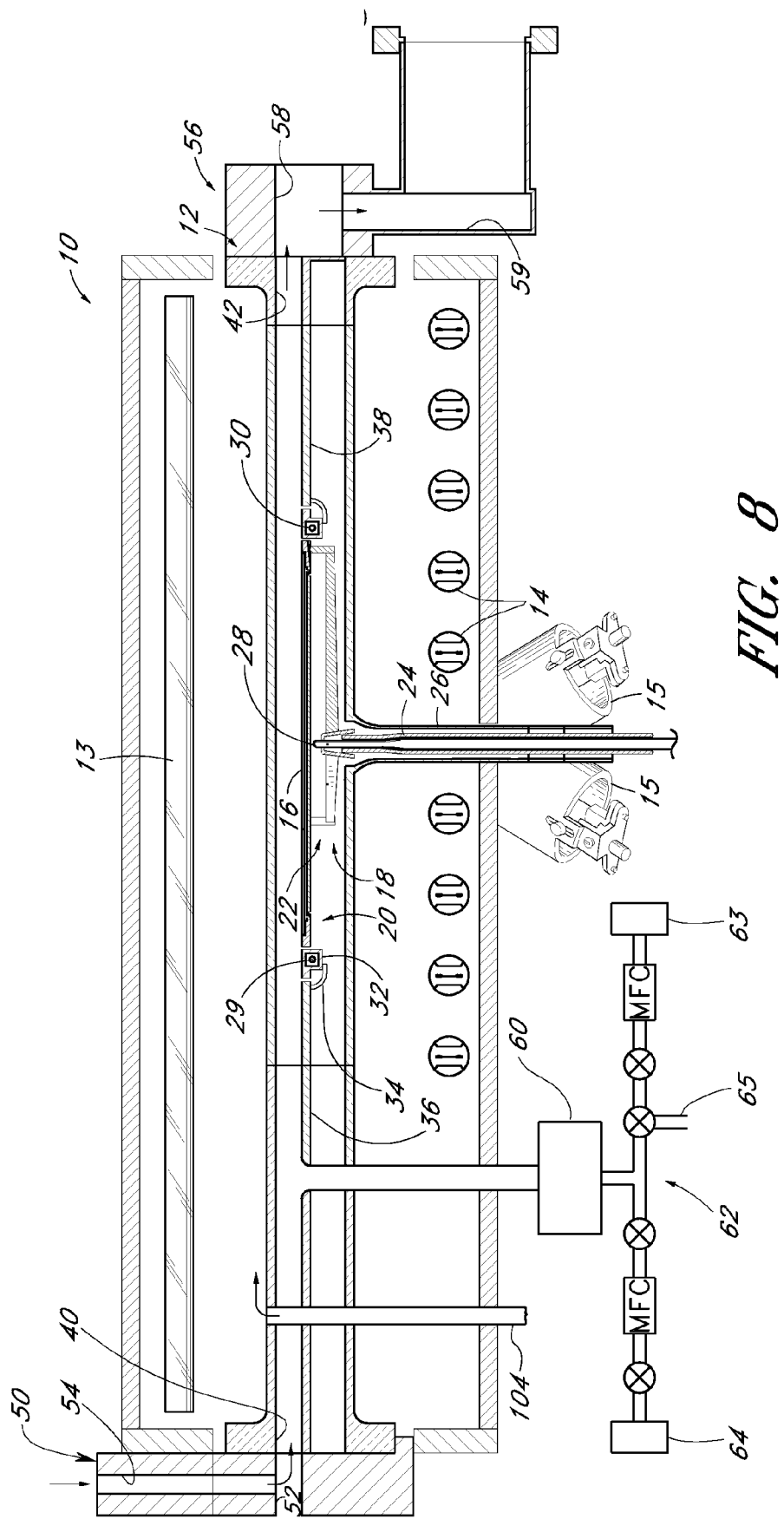
FIG. 8 is a schematic sectional view of an exemplary single-substrate process chamber, with the liquid injector arranged according to other preferred embodiments of the invention.

Also, while the illustrated embodiments generally show the gas injector 104 having an outlet 112 in the generally vertical inlet 54, in other embodiments the injector 104 can discharge directly into the inlet port 40 or directly into the interior volume of the process chamber 12, as shown in FIG. 8.

Moreover, as shown in FIG. 9, while separate openings to the inlet port 40 may be utilized for the gas and the liquid precursors, the gas precursors may also be flowed into the process chamber 12 through the liquid injector 104. For example, all gas lines and all liquid precursors can be connected to the liquid injector 104, so that the injector 104 is in fluid communication with both gases and liquids. Such an arrangement advantageously reduces the complexity of the inlet port 40 and the generally vertical inlet 54 by reducing the number of connections to those parts.

It will be appreciated that the liquid precursor mixtures are preferably chosen such that the constituent precursors in the mixture do not react while stored or being delivered to the process chamber 12 to a degree sufficient to adversely affect the quality of the deposited silicon-containing layers. Where the reaction of precursors with each other may be significant, the precursors are preferably stored separately. In particular, in other embodiments, the liquid precursor source can contain trisilane as the only precursor, as indicated by trisilane source 100 (FIGS. 2 and 9). Similarly, a liquid dopant source 106 can be utilized to provide dopant precursors to the process chamber 12. Each of trisilane source 100 and trisilane mixture 102 can be connected to a separate liquid injector, or both can be connected to the same gas injector. In such arrangements, the liquid injection of trisilane and/or the dopants into the process chamber 12 still retain the benefits of precise metering of the precursors, especially in comparison to the bubbler systems typically used for delivering liquid precursors, due to the ability to meter the precursors as liquids. In addition, the trisilane preferably forms a homogeneous solution with the other precursor(s), although in other embodiments, an active mixing of the mixture may be necessary to achieve an acceptable blend of trisilane with precursors which are, for example, immiscible with trisilane.

It will also be appreciated that while discussed in the context of mixtures with dopants, trisilane can also be provided in a mixture with other precursors, to form other silicon-containing layers, e.g., layers of a silicon compound, such as SiGe, SiGeC, SiN, SiC or SiSnC (or, e.g., more particularly, $Si_{1-x}Ge_x$, $Si_{1-x-y}Ge_xC_y$, SiN, SiC, $Si_{1-y}C_y$, and $Si_{1-x-y}Sn_xC_y$).

Exemplary germanium precursors for forming compound layers include silogermanes ($SiH_3(4-x)GeH_x$, where x preferably is 0-3). Exemplary carbon precursors include silomethanes ($SiH_3(4-x)CH_x$, where x preferably is 0 or 1) and exemplary nitrogen precursors include siloamines ($SiH_3(4-x)NH_{x-1}$, where x is 1-3 and is preferably 1). To form compounds such as SiGeC, it will be appreciated that combinations of these precursors can be used. These precursors preferably do not react with the trisilane while stored in the mixture; rather, they preferably react only upon an injection of activation energy in the reactor chamber (e.g., by exposing the vaporized mixture to a heated surface of a substrate). In other embodiments, layers comprising silicon compounds can be can be formed by mixing trisilane with other precursors downstream of the point at which the trisilane is vaporized, e.g., by mixing the precursor in vapor form in the gas line before entering the process chamber or by introducing the trisilane and the precursors separately, so that they first mix inside the process chamber. Advantageously, providing a supply of precursor, whether for doping or for forming a compound layer, that is separate from the trisilane allows the concentration of that precursor to be varied, thus allowing the formation of graded layers.

Figure 10:
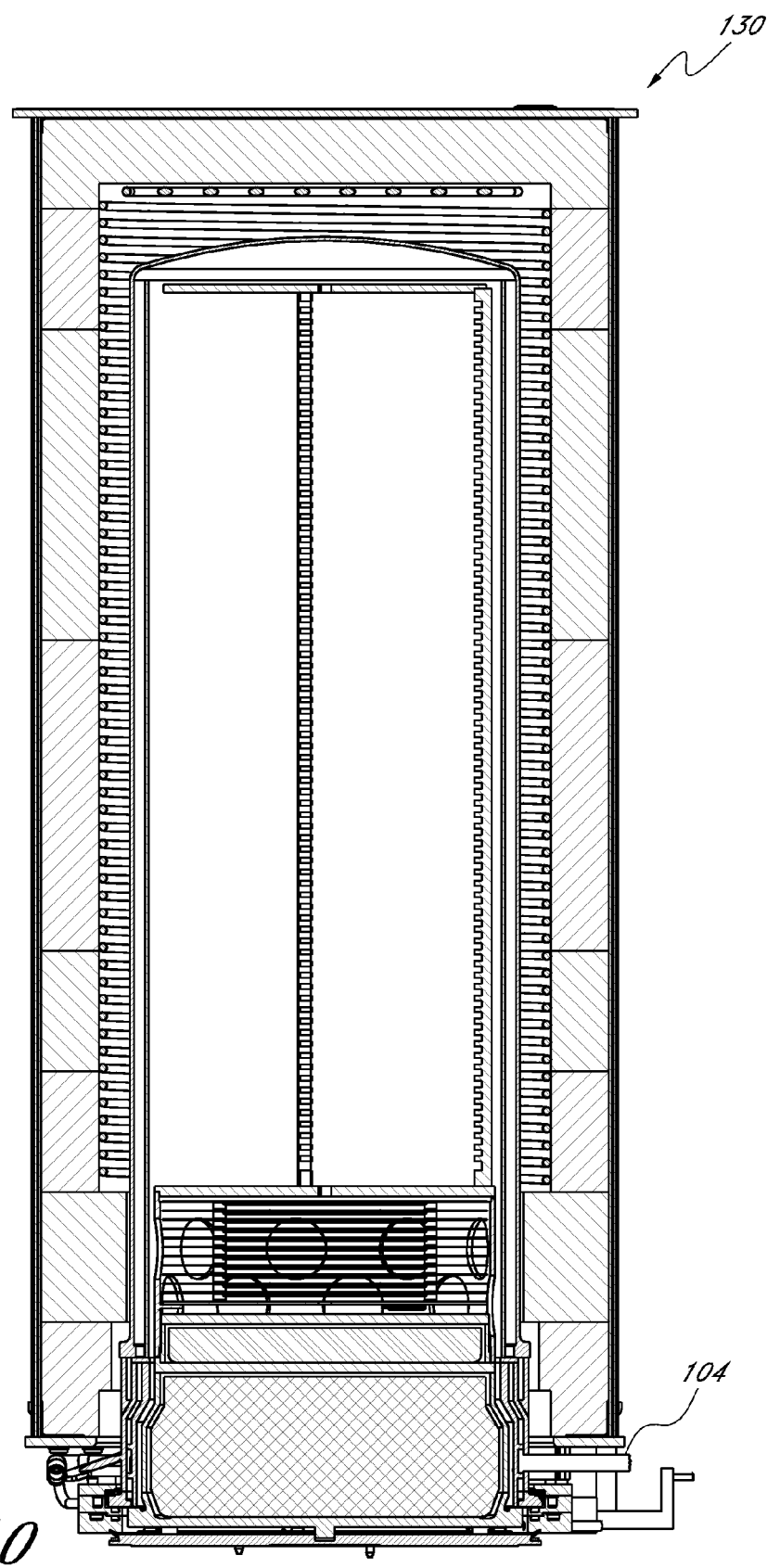
FIG. 10 is a schematic sectional view of an exemplary batch reactor furnace for use with preferred embodiments of the invention.

In addition, while the preferred embodiments are presented in the context of a single-substrate, horizontal flow cold-wall reactor, the invention will have application to various types of reactors known in the art and, as such, the invention is not limited to a single-substrate reactor. For example, as illustrated in FIG. 10, a batch reactor 130 can be used with the liquid injectors 104 discussed above and have the advantage of allowing for increased throughput due to the ability to simultaneously process a plurality of wafers. A suitable batch reactor is available commercially under the trade name A412™ from ASM International, N.V. of The Netherlands. In addition to flowing vaporized precursor from a single liquid injector outlet, the liquid precursor may be utilized in other configurations to allow more uniform precursor flow through the interior of the batch reactor. For example, a plurality of liquid injectors, preferably near the base of the interior of the reactor, may be utilized, or the injectors may be utilized with other devices known in the art, such as showerheads or reactor bases having a plurality of evenly distributed holes, as described, e.g., in U.S. patent application Ser. No. 10/390, 509, filed Mar. 13, 2003 and entitled PROCESS TUBE SUPPORT SLEEVE WITH CIRCUMFERENTIAL CHANNELS, to more uniformly distribute the precursor gas.

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method for semiconductor processing, comprising:
    exposing a liquid silicon precursor to a hot ambient to convert the liquid silicon precursor into a precursor gas, the liquid silicon precursor comprising trisilane; and
    flowing the precursor gas through a process chamber to deposit a silicon-containing film on a semiconductor substrate in the process chamber,
    wherein a temperature of the hot ambient is greater than a boiling point of trisilane under processing conditions at a location where converting a liquid silicon precursor occurs, and the liquid silicon precursor is converted into the precursor gas before entry of the liquid silicon precursor into the process chamber;
    wherein converting the liquid silicon precursor into the precursor gas comprises flowing liquid silicon precursor through a liquid injector, wherein the hot ambient is a surface of the liquid injector.

2. The method of claim 1, wherein the process chamber is a single substrate process chamber.

3. The method of claim 1, further comprising flowing a gaseous precursor though the liquid injector and into the process chamber.

4. The method of claim 1, wherein the liquid silicon precursor comprises a dopant.

5. The method of claim 4, wherein the dopant has a boiling point within about 60° C. of a boiling point of the liquid silicon precursor under process conditions.

6. The method of claim 5, wherein the dopant has a boiling point within about 40° C. of a boiling point of the liquid silicon precursor under process conditions.

7. A method for semiconductor processing, comprising:
    exposing a liquid silicon precursor to a hot ambient to convert the liquid silicon precursor into a precursor gas, the liquid silicon precursor comprising trisilane; and
    flowing the precursor gas though a process chamber to deposit a silicon-containing film on a semiconductor substrate in the process chamber,
    wherein a temperature of the hot ambient is greater than a boiling point of trisilane under processing conditions at a location where converting a liquid silicon precursor occurs, and the liquid silicon precursor is converted into the precursor gas before entry of the liquid silicon precursor into the process chamber;
    wherein converting the liquid silicon precursor into the precursor gas comprises flowing liquid silicon precursor though a liquid injector, wherein the hot ambient is a porous matrix for receiving the liquid silicon precursor in the liquid injector.

8. A method for semiconductor processing, comprising:
    exposing a pre-metered amount of a liquid silicon precursor mixture to a hot ambient to convert the liquid silicon precursor mixture into a precursor gas, the liquid silicon precursor mixture comprises trisilane and a dopant;
    flowing the precursor gas though a process chamber to deposit a silicon-containing film on a semiconductor substrate in the process chamber,
    wherein a temperature of the hot ambient is greater than a boiling point of trisilane under processing conditions at a location where converting a liquid silicon precursor mixture occurs; and
    wherein the dopant has the chemical formula $(H_3Si)_{3-x}MH_x$, where x=1-3 and M=As, P, or B.

9. The method of claim 8, wherein x=3 and M=P or As.

10. The method of claim 8, wherein the dopant has a boiling point within about 60° C. of a boiling point of the liquid silicon precursor under process conditions.

11. The method of claim 10, wherein the dopant has a boiling point within about 40°C. of a boiling point of the liquid silicon precursor under process conditions.

* * * * *